United States Patent
Levison et al.

(10) Patent No.: US 6,366,938 B1
(45) Date of Patent: Apr. 2, 2002

(54) REDUCED POWER MATCHED FILTER USING PRECOMPUTATION

(75) Inventors: Jacob Levison, Malmo (SE); Paul W. Dent, Pittsboro, NC (US)

(73) Assignee: Ericsson, Inc., Research Triangle Park, NC (US)

( * ) Notice: Subject to any disclaimer, the term of this patent is extended or adjusted under 35 U.S.C. 154(b) by 0 days.

(21) Appl. No.: 09/343,468

(22) Filed: Jun. 30, 1999

Related U.S. Application Data (63) Continuation-in-part of application No. 08/967,444, filed on Nov. 11, 1997, now Pat. No. 5,931,893.

(51) Int. Cl.⁷ .............................................. G06F 17/15
(52) U.S. Cl. ..................... 708/422; 708/314; 375/343
(58) Field of Search ............................... 708/422, 423, 708/603, 314; 375/343

(56) References Cited

U.S. PATENT DOCUMENTS

| 4,660,164 A | 4/1987 | Leibowitz | |
|---|---|---|---|
| 4,862,402 A | * 8/1989 | Shah et al. | 708/315 |
| 6,005,899 A | * 12/1999 | Khayrallah | 375/343 |
| 6,005,903 A | * 12/1999 | Mendelovicz | 708/422 |
| 6,157,684 A | * 12/2000 | Yang et al. | 375/343 |

FOREIGN PATENT DOCUMENTS

| WO | WO 00/31659 | 6/2000 |
|---|---|---|
| WO | 00/15964 | 9/2000 |

* cited by examiner

*Primary Examiner*—David H. Malzahn
(74) *Attorney, Agent, or Firm*—Gregory A. Stephens (57) ABSTRACT

A technique for correlating a sequence of signal sample values with a predetermined digital code to produce correlation values for shifts in the sequence of signal sample values relative to the predetermined digital code is disclosed. The technique is realized by combining subgroups of the signal sample values in the sequence to form sets of precombinations, and then selecting one precombination from each set of precombinations to provide a plurality of selected precombinations. The plurality of selected precombinations are then added or subtracted to produce a correlation value corresponding to a shift in the sequence of signal sample values.

37 Claims, 9 Drawing Sheets

REDUCED POWER MATCHED FILTER USING PRECOMPUTATION

CROSS-REFERENCE TO RELATED APPLICATIONS

This patent application is a continuation-in-part patent application of U.S. patent application Ser. No. 08/967,444, entitled "Efficient Correlation Over a Sliding Window", filed Nov. 11, 1997, now U.S. Pat. No. 5,931,893, and which is hereby incorporated by reference herein in its entirety.

This patent application is related to U.S. patent application Ser. No. 09/197,597, entitled "Reduced Power Matched Filter", filed Nov. 23, 1998, now U.S. Pat. No. 6,330,292 which is also a continuation-in-part patent application of the above-referenced U.S. patent application Ser. No. 08/967, 444, now U.S. Pat. No. 5,931,893 and which is also hereby incorporated by reference herein in its entirety.

FIELD OF THE INVENTION

The present invention relates generally to matched filters for digitally coded signals and, more particularly, to a matched filter using precomputation to reduce power consumption in radio receivers of Code Division Multiple Access (CDMA) signals.

BACKGROUND OF THE INVENTION

The cellular telephone industry has made phenomenal strides in commercial operations in the United States as well as the rest of the world. Growth in major metropolitan areas has far exceeded expectations and is outstripping system capacity. If this trend continues, the effects of rapid growth will soon reach even the smallest markets. Innovative solutions are required to meet these increasing capacity needs as well as maintain high quality service and avoid rising prices.

Throughout the world, one important step in cellular systems is to change from analog to digital transmission. Equally important is the choice of an effective digital transmission scheme for implementing the next generation of cellular technology. Furthermore, it is widely believed that the first generation of Personal Communication Networks (PCNs) employing low cost, pocket-size, cordless telephones that can be carried comfortably and used to make or receive calls in the home, office, street, car, etc. will be provided by cellular carriers using the next generation of digital cellular system infrastructure and cellular frequencies. The key feature demanded of these new systems is increased traffic capacity.

Currently, channel access is achieved using Frequency Division Multiple Access (FDMA), Time Division Multiple Access (TDMA), and Code Division Multiple Access (CDMA) methods. In FDMA systems, a communication channel is a single radio frequency band into which a signal's transmission power is concentrated. Interference with adjacent channels is limited by the use of bandpass filters that only pass signal energy within the filters' specified frequency bands. Thus, with each channel being assigned a different frequency, system capacity is limited by the available frequencies as well as by limitations imposed by channel reuse.

In TDMA systems, a channel consists of a time slot in a periodic train of time intervals over the same frequency. Each period of time slots is called a frame. A given signal's energy is confined to one of these time slots. Adjacent channel interference is limited by the use of a time gate or other synchronization element that only passes signal energy received at the proper time. Thus, the problem of interference from different relative signal strength levels is reduced.

Capacity in a TDMA system is increased by compressing the transmission signal into a shorter time slot. As a result, the information must be transmitted at a correspondingly faster burst rate that increases the amount of occupied spectrum proportionally.

With FDMA or TDMA systems or hybrid FDMA/TDMA systems, the goal is to ensure that two potentially interfering signals do not occupy the same frequency at the same time. In contrast, CDMA systems allow signals to overlap in both time and frequency. Thus, all CDMA signals share the same frequency spectrum. In both the frequency and the time domain, the multiple access signals overlap. Various aspects of CDMA communications are described, for example, in "On the Capacity of a Cellular CDMA System," by Gilhousen, Jacobs, Viterbi, Weaver and Wheatley, *IEEE Trans. On Vehicular Technology*, May 1991.

In a typical CDMA system, the informational data stream to be transmitted is impressed upon a much higher bit rate data stream generated by a pseudo-random noise code (PNcode) generator. The informational data stream and the higher bit rate code data stream are typically multiplied together. This combination of the lower-bit rate informational data stream with the higher bit rate code data stream is called coding or spreading the informational data stream signal. Each informational data stream or channel is allocated a unique spreading code. A plurality of coded information signals are transmitted on radio frequency carrier waves and jointly received as a composite signal at a receiver. Each of the coded signals overlaps all of the other coded signals, as well as noise-related signals, in both frequency and time. By correlating the composite signal with one of the unique spreading codes, the corresponding information signal is isolated and decoded.

There are a number of advantages associated with CDMA communication techniques. The capacity limits of CDMA-based cellular systems are projected to be up to twenty times that of existing analog technology as a result of the wideband CDMA system's properties such as improved coding gain/modulation density, voice activity gating, sectorization and reuse of the same spectrum in every cell. CDMA is virtually immune to multi-path interference, and eliminates fading and static to enhance performance in urban areas. CDMA transmission of voice by a high bit rate encoder ensures superior, realistic voice quality. CDMA also provides for variable data rates allowing many different grades of voice quality to be offered. The scrambled signal format of CDMA eliminates cross-talk and makes it very difficult and costly to eavesdrop or track calls, insuring greater privacy for callers and greater immunity from air-time fraud. In communication systems following the CDMA or "spread spectrum" concept, the frequency spectrum of an informational data stream is spread using a code uncorrelated with that of the data signals. The codes are also unique to every user. This is the reason why a receiver that has knowledge about the code of the intended transmitter is capable of selecting the desired signal.

There are several different techniques to spread a signal. Two of the most popular are Direct-Sequence (DS) and Frequency-Hopping (FH), both of which are well known in the art. According to the DS technique, the data signal is multiplied by an uncorrelated pseudo-random code (i.e., the previously described PNcode). The PNcode is a sequence of chips (bits) valued at −1 and 1 (polar) or 0 and 1 (non-polar) and has noise like properties. One way to create a PNcode is by means of at least one shift register. When the length of such a shift register is N, the period, $T_{DS}$, is given by the equation $T_{DS}=2^N-1$.

In a receiver in a CDMA system, the received signal is multiplied again by the same (synchronized) PNcode. Since the code consists of +1's and −1's (polar), this operation removes the code from the signal and the original data signal is left. In other words, the despreading operation is the same as the spreading operation.

Figure 1:
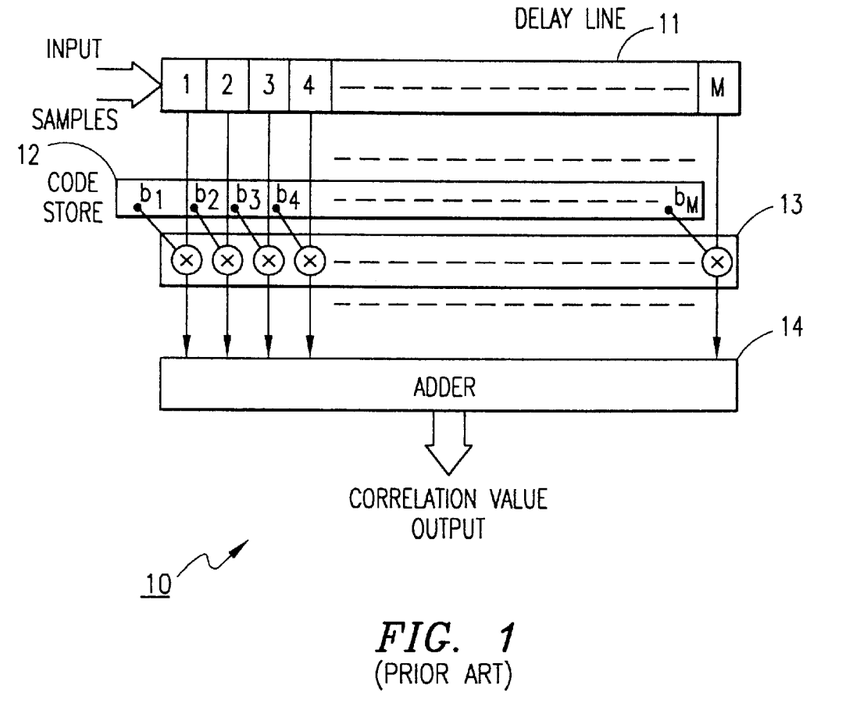
FIG. 1 is a schematic diagram of a first prior art correlator that does not compute precombinations.

Referring to FIG. 1, there is shown a schematic diagram of a prior art correlator 10 which is used to compute correlations between the last M signal samples received and an M-bit codeword. An M-element delay line 11 stores received signal samples and sequentially shifts them through each of the M stages. Consequently, the delay line memory elements contain the last M signal sample values received. After each new signal sample is shifted in and each old signal sample is shifted out, the M signal sample values are read out of the delay line into M sign-changers 13, where the M signal sample values are multiplied by +1 or −1 according to the bits $b_1 \ldots b_M$ of a predetermined code stored in code store 12 with which correlation is to be computed. The sign-changed values are then summed in adder 14 to produce a correlation result.

In general, the process of correlating an M-element vector A=(a1, a2 ... aM) with an M-element vector B=(b1,b2 ... bM) involves forming the inner product A·B=a1·b1+a2·b2+ ... aM·bM. When the elements of one of the vectors (e.g., B) comprises only binary values (arithmetically +1 or −1), the products such as a1·b1 simplify to ±a1, but the process of adding the M values ±a1,±a2, ... ±aM is still a significant effort when it has to be performed for every new value of "a" received.

The prior art includes many variations of the correlator 10 shown in FIG. 1. For example, signal samples may be single-bit or "hard-limited" quantities of only +1 or −1 instead of multi-bit quantities. The sign-changers 13 used then are typically simple XOR gates. In that case, the adder 14 may first add pairs of single-bit values to obtain M/2 two-bit values; M/4 two-bit adders then add two-bit values to obtain M/4 three-bit values, and so on. Such a structure, known as an "adder tree", is simpler when the input values are single-bit rather than multi-bit values.

For single-bit value signal samples, the adder tree can be replaced by an up/down counter that scans the M values, and counts up when a +1 is encountered and down when a −1 is encountered. Likewise, for multi-bit value signal samples, a parallel adder tree can be replaced by a sequential adder that extracts each of the M values, in turn, from the delay line memory and adds it to an accumulator. In the latter case, the logic employed must operate M-times as fast as in the parallel adder case. Consequently, there is a trade-off between the overall speed of the correlator and the logic complexity. Nevertheless, in each of the above-described prior art correlator variations, it is necessary to combine M values anew after each new signal sample is received. This can result in large amounts of power being consumed, particularly when the power supply is a portable supply such as a battery.

Figure 2:
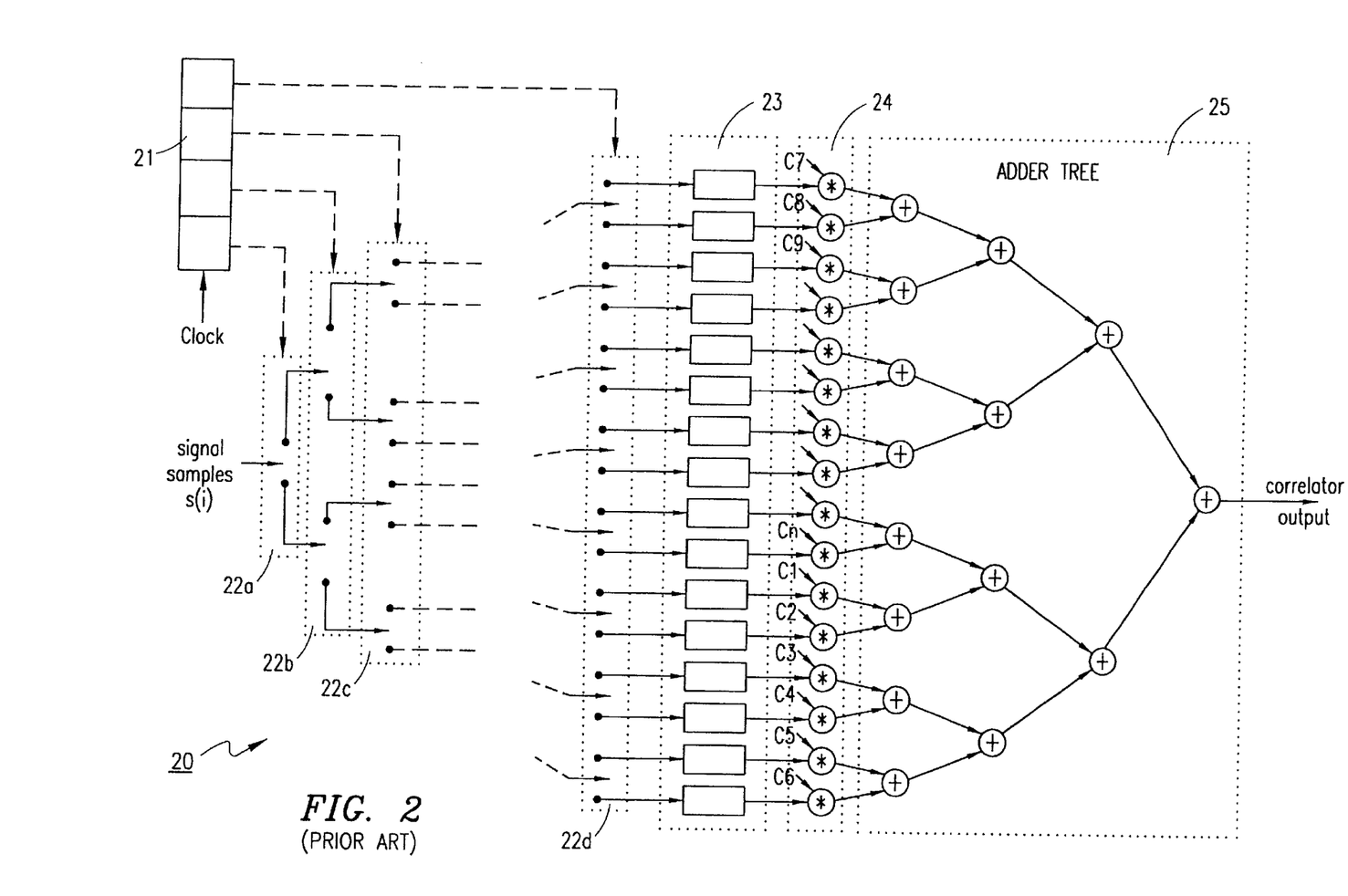
FIG. 2 is a schematic diagram of a second prior art correlator that does not compute precombinations.

Referring to FIG. 2, there is shown a schematic diagram of another prior art correlator 20, this one having an address counter 21, a switch matrix 22, a plurality of stores 23, a corresponding plurality of sign-changers 24, and an adder tree 25. Each new signal sample, S(i), is input to a first stage 22a of the switch matrix 22 that is controlled by the address counter 21 to steer the input value of the signal sample to the next available one of stores 23, which will be the store that was last used "n" samples previously to store sample S(i−n). Sample S(i−n) is thus overwritten by the new sample S(i). The purpose of the switch matrix 22 is to connect the input sample lines only to the store selected by the address counter 21 in order, to reduce the capacitive loading on the input lines, and thereby reduce power consumption when operating at a high sample rate. The first stage 22a of the switch matrix 22 is controlled by a first bit of the address counter 21 to steer the input value either to a first of the second stage switches 22b or to a second of the second stage switches 22b. A second bit of the address counter 21 operates the second stage switches to steer the input value to one of four third stage switches 22c, and so forth, until a final stage of switches 22d steers the input value to a unique one of stores 23. The first address counter bit used to control switch 22a is preferably the most rapidly changing address counter bit, while the more numerous switches in the final stage of switches 22d are preferably controlled by the most slowly varying bit of the address counter 21, thereby minimizing the power consumption associated with toggling switches. By this means, the stores 23 memorize the last "n" input sample values, where "n" is a power of two in this example. Of course, "n" can also be less than a power of two and the address counter 21 can be arranged to count from 0 to n−1 and then reset to zero. Since only one store value is modified at each sample clock instant, the power consumption of this arrangement is much lower than shifting the input values through an "n"-stage shift register, where all "n" values would change at each sample clock instant, such as in the correlator 10 of FIG. 1. The difference is that, in the shift register case, the first register always contains the most recent signal sample, S(i). In the correlator 20 of FIG. 2, however, the store that contains the most recent signal sample, S(i), rotates cyclically as "i" increments, but is nevertheless indicated by the value of the address counter 21.

The correlation to be computed is given by the expression, $$Cn·S(i)+C(n-1)·S(i-1)+C(n-2)·S(i-2) \ldots +C(1)·S(i·n+1) \quad (1)$$

where (C1,C2,C3 ... C(n)) is an n-bit code with each code bit having a value of +1 or −1. Multiplications by +1 or −1 are simply performed by either changing the sign (for −1) or not (for +1) using the sign-changers 24 controlled by the respective code bit. The code bits are supplied by a code generator (not shown) that must rotate the code such that Cn is applied to the multiplier in the sign-changer 24 that is connected to the store 23 containing the most recent signal sample S(i), which is indicated by the address counter 21. Since the code comprises single bit values, it is preferable to rotate the code rather than rotate the contents of stores 23, which hold multi-bit signal samples.

The sign-changed outputs from the sign-changer 24 are added in the adder tree 25, which adds pairs at a time. The number of stages of the adder tree 25 that are required to produce the final correlation value output is the same as the number of switch stages $22a \ldots 22d$ needed to address a unique one of stores 23 (i.e., $LOG_2(n)$ stages). Thus, a 64-bit correlator comprises sixty-four stores 23, six stages of input steering switches 22, and six stages of adder tree 25 totaling 32+16+8+4+2+1=63 adders.

Although the input steering arrangement in the correlator 20 of FIG. 2 gives significant power economies compared to a shift register, the number of additions per correlation value computed is still equal to 63. That is, the number of additions has not been reduced through the use of the correlator 20 of FIG. 2. Thus, similar to the correlator 10 of FIG. 1, the number of additions required in the correlator 20 of FIG. 2 can result in large amounts of power being consumed, particularly when the power supply is a portable supply such as a battery.

In view of the foregoing, it would be desirable to provide a matched filter that minimizes computations so as to reduce power consumption.

SUMMARY OF THE INVENTION

According to the present invention, a technique for correlating a sequence of signal sample values with a predetermined digital code to produce correlation values for shifts in the sequence of signal sample values relative to the predetermined digital code is provided. In one embodiment, the technique is realized by combining subgroups of the signal sample values in the sequence to form sets of precombinations, and then selecting one precombination from each set of precombinations to provide a plurality of selected precombinations. The plurality of selected precombinations are then added or subtracted to produce a correlation value corresponding to a shift in the sequence of signal sample values.

The predetermined digital code is typically a segment of a direct-sequence spread-spectrum spreading code. The predetermined digital code can be a real code, and the signal sample values can be real values. Alternatively, the predetermined digital code can comprise a real code and an imaginary code, and the signal sample values can be complex values.

In accordance with other aspects of the present invention, the sets of precombinations are formed from sums and differences of pairs of the signal sample values. The sets of precombinations can be formed from sums and differences of pairs of real or pairs of imaginary signal sample values. In such a case, the sets of precombinations are preferably formed from a sum and a difference of the real part of one signal sample value and the imaginary part of another signal sample value.

In accordance with further aspects of the present invention, the sets of precombinations are formed from all possible combinations of sums and differences of a given number of the signal sample values. In such a case, only one sign polarity is beneficially used with one of the signal sample values, thereby halving the number of precombinations formed in each set of precombinations.

In accordance with still further aspects of the present invention, pairs of precombinations are beneficially combined from an oldest set of precombinations to delete the contribution of an oldest one of the signal sample values in the oldest set of precombinations, the result is then combined with a newest signal sample value to produce an updated set of precombinations. Preferably, the updated set of precombinations is produced each time a new signal sample value is received, and the updated set of precombinations overwrites the oldest set of precombinations in the storage device. The oldest set of precombinations is the set of precombinations that depends upon the oldest signal sample value the contribution of which has not yet been deleted.

In accordance with still further aspects of the present invention, the sets of precombinations are preferably stored after they are formed. The sets of precombinations are typically stored in a storage device, which is preferably a circular buffer. The storage device beneficially includes a routing switch tree for routing a set of precombinations to a designated set of storage elements. Such a routing switch tree is preferably a binary tree comprising a number of stages equal to the logarithm to the base two of the number of storage locations for sets of precombinations. A stage of the binary routing switch tree having a smaller number of switch elements preferably switches route more frequently than a stage having a greater number of switch elements. Preferably, the storage device stores the sets of precombinations in an order which is bit-reversed relative to the time-sequential order of their formation.

In accordance with still further aspects of the present invention, the selection of the precombinations is preferably controlled by a corresponding sub-group of bits of the predetermined digital code, and each selected precombination is then preferably added or subtracted according to the polarity of one of the bits of the corresponding subgroup of bits. Each selected precombination is beneficially multiplied with a corresponding preselected bit from the predetermined digital code to change or affirm the polarity of each selected precombination.

In accordance with still further aspects of the present invention, the predetermined digital code comprises a first number of code symbols and the sets of precombinations are formed of a subgroup containing a second number of signal sample values not divisible into the first number. The present invention can then be realized as a matched filter comprising a correlator for correlating with a predetermined code of a length that is divisible by the second number.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF A PREFERRED EMBODIMENT

Figure 3:
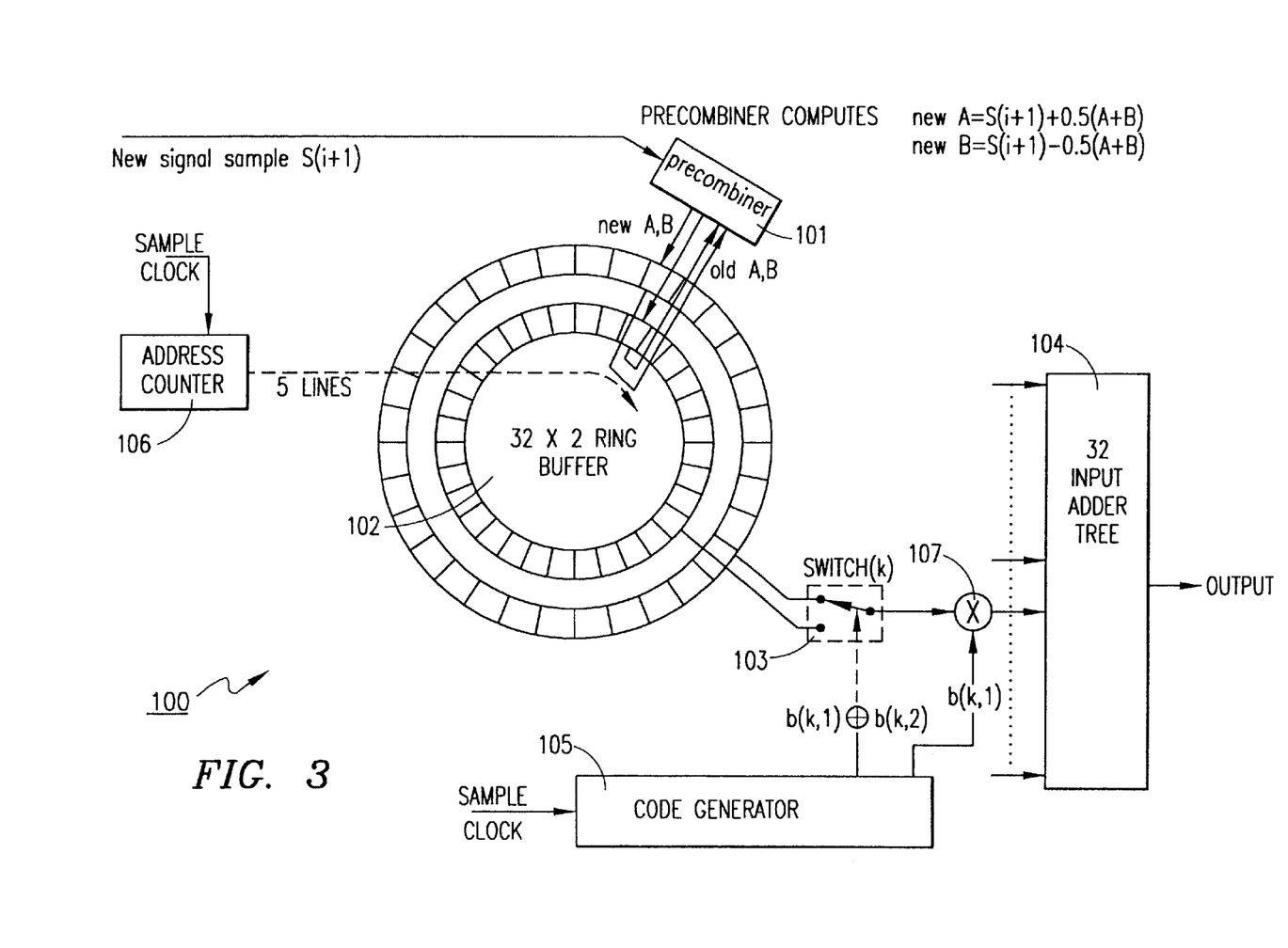
FIG. 3 is a schematic diagram of a correlator that precomputes a sum and a difference in accordance with the present invention.

Referring to FIG. 3, there is shown a correlator 100 for correlating signal samples with a code word by precomputing a sum and a difference in accordance with the present invention. The correlator 100 comprises a precombiner 101, a pair of concentric rings of stores 102, a set of selector switches 103, a 32-input adder tree 104, a code generator 105, a 6-bit address counter 106, and a multiplier 107. Similar to FIG. 2, a 64 bit correlation is assumed for the correlator 100 of FIG. 3, and the 64 stores 12 in FIG. 2 are now illustrated as the pair of concentric rings of stores 102 in FIG. 3. The pair of concentric rings of stores 102 have 32 storage buffer elements in each ring, making 64 total. The 6-bit address counter 106 divides a sample clock by 64, but only the most significant 5 bits are used to address the two concentric rings 102 of 32 stores so that the stores that are addressed change only on every alternate sample clock.

Input signal samples are fed to the precombiner 101. The purpose of precombiner 101 is to form the sum and the difference of pairs of input samples. For example, expression (1) from above for the desired correlation may be rearranged in the following form:

$$Cn \cdot ((S(i) + Cn \cdot C(n-1) \cdot S(i-1)) + \qquad (2)$$

$$C(n-2) \cdot (S(i-2) + C(n-2) \cdot C(n-3) \cdot S(i-3)) +$$

$$C(n-4) \cdot (S(i-4) + C(n-4) \cdot C(n-5) \cdot S(n-5)) +$$

$$\vdots$$

$$C(2) \cdot (S(i-n+2)) + C(2) \cdot C(1) \cdot S(i-n+1))$$

Now each term such as $S(i-2)+C(n-2) \cdot C(n-3) \cdot S(n-3)$ is either a sum $$S(i-2)+S(i-3)$$

or a difference $$S(i-2)-S(i-3)$$

depending on whether $C(n-2) \cdot C(n-3)$ is +1 or −1. The +1 value applies if code bits $C(n-2)$ and $C(n-3)$ are of the same polarity, otherwise the −1 value applies. Consequently, if both the sum and the difference are already precomputed, the difference is selected if the two consecutive code bits are different, otherwise the sum i of input samples and the other ring stores the differences.

The set of selector switches 103, of which only one, switch number "k", is shown for purposes of clarity, selects either a store in the inner ring or a store in the outer ring depending on the modulo two sum of two bits b(k,1) and b(k,2), which are two consecutive, selected code bits supplied by the code generator 105. The notation b(k,j) is used for the selected ones of code bits C to indicate that the correspondence between bits "b" and bits C is not a constant one, but changes rotationally as the code bits must be rotated against the stored values. Each sum or difference selected by the selector switches 103 is sign-changed according to the value of b(k,1) in an associated multiplier 107. The 32 sign-changed sums or differences are then added in the 32-input adder tree 104 to form the correlation value. The 32-input adder tree 104 adds values in pairs as does the adder tree 13 of FIG. 2, but now comprises only 16+8+4+2+1=31 adders, or approximately half the number compared to that of FIG. 2. The number of additions to form the correlation result has thus been halved, thereby consequently halving the power consumption in the adder tree 104.

If the expression (2) for the correlation in terms of sums and differences is rewritten for the next sample clock upon receipt of S(i+1), we obtain $$Cn \cdot (S(i+1) + C(n) \cdot C(n-1) \cdot S(i)) + \qquad (3)$$

$$C(n-2) \cdot (S(i-1) + C(n-2) \cdot C(n-3) \cdot S(i-2)) +$$

$$\vdots$$

$$C(2) \cdot (S(i-n+3) + C2 \cdot C1 \cdot S(i-n+2))$$

which already is seen to depend on the sum and difference of a different pair of values, S(i+1) and S(i), compared to expression (2). One solution is to use a duplicate arrangement to compute the correlation result for odd sample clock cycles compared to even sample clock cycles. Since each would be used half the time, the power consumption of each would be one quarter that of FIG. 2, and the total power would be half that of FIG. 2, as intended. However, the number of stores would be doubled, increasing the substrate area for an integrated circuit realization. To avoid duplication, we instead rewrite the expression (3) for the next correlation as:

$$C(n-1) \cdot (S(i) + C(n-1) \cdot C(n-2) \cdot S(i-1)) + \qquad (4)$$

$$C(n-3) \cdot (S(i-2) + C(n-3) \cdot C(n-4) \cdot S(i-3)) +$$

$$\vdots$$

$$C3 \cdot (S(i-n+4) + C3 \cdot C2 \cdot S(i-n+3)) +$$

$$C1 \cdot (S(i-n+2) + C1 \cdot Cn \cdot S(i+1))$$

which may be seen now to depend on the sums and differences of the same pairs of value between the most recent sample S(i+1) and the second oldest sample S(i−n+2). This may be computed without having to remember old sample values as well as sums and differences as follows.

Suppose a sum store A holds an old sum value $$S(i-n+2)+S(i-n+1),$$

while a difference store B holds an old value $$S(i-n+2)-S(i-n+1).$$

The second oldest sample value S(i−n+2) may therefore be reconstructed as:

$$(A+B)/2$$

in which S(i−n+1) will cancel out. Therefore, the precombiner 101 is arranged to combine the oldest sum and difference values A and B with the latest sample S(i+1) according to:

$$\text{new A value} = S(i+1)+(A+B)/2 = S(i+1)+S(i-n+2) \qquad (5a)$$

and $$\text{new B value} = S(i+1)-(A+B)/2 = S(i+1)-S(i-n+2) \qquad (5b)$$

By choosing the values b(k,2) and b(k,1) to be appropriate selections of the code bits C(i), the correct correlation value is computed from the old sums and differences and the one new sum and difference given by equations (5).

At the next sample clock instant, S(i+2) arrives, and the precombiner 101 performs the same operation again according to equation (5) without changing the addressed stores A and B, now obtaining:

$$\text{new A value} = S(i+2)+(A+B)/2 = S(i+2)+S(i+1) \qquad (6a)$$

and $$\text{new B value} = S(i+2)-(A+B)/2 = S(i+2)-S(i+1) \qquad (6b)$$

as the contribution of S(i−n+2) now cancels out. Again, correct selection by code generator 105 of bits b(k,2) and b(k,1) from the code bits C(i) will provide the correct correlation result. After the precombiner 101 has computed equations (6), the stored sums and differences are as required to use equation (2) again, with the value of "i" having been incremented by 2, and the address counter 106 now addressing the next pair of sum/difference stores A,B in the ring buffer 102. Thus, the correlator 100 can compute both the even and odd correlation values based on substantially the same stored sums and differences by using precombiner 101 to change a stored sum and difference A,B once using equation (5) for computing an odd correlation and to change the same stores A,B again, using equation (6), before address counter 106 advances the address of A and B prior to computing the next even correlation value. Since equations (5) and (6) are basically the same, the precombiner 101 performs exactly the same operation for both even and odd correlations, which is a simplifying feature of the present invention. Moreover, the code generator 105 supplies the same 64 output bit values for all even correlations, merely rotating the outputs one position for each new even correlation, alternating with supplying another 64 output bit values for odd correlations, which are also always the same, but just rotated between successive odd correlations.

The principle may be extended to computing more precombinations of a greater number of input samples. For example, there are 16 possible combinations of four input samples, of which 8 are just the negatives of the other 8. Therefore, it suffices to compute and store 8 precombinations of 4 input samples. In this case, the number of precombinations needed is double the number of original samples, requiring twice the ring buffer size, which would be a 16×8 buffer for a 64-bit correlator. Expressing the 64-bit correlation as the sum of 16 precombinations, selected one from each group of 8, allows a correlation to be computed using only 8+4+2+1=15 additions. The desired correlation is expressed as:

$$Cn \cdot (S(i) + Cn \cdot C(n-1) \cdot S(i-1) + Cn \cdot C(n-2) \cdot S(i-2) + \quad (7)$$
$$Cn \cdot C(n-3) \cdot S(i-3)) + C(n-4) \cdot (S(i-4) + C(n-5) \cdot$$
$$S(i-5) + C(n-4) \cdot C(n-6) \cdot S(i-6) +$$
$$C(n-4) \cdot C(n-7) \cdot S(i-7)) +$$
$$\vdots$$
$$C4 \cdot (S(i-n+4) + C4 \cdot C3 \cdot S(i-n+3) +$$
$$C4 \cdot C2 \cdot S(i-n+2) + C4 \cdot C1 \cdot S(i-n+1))$$

Terms from expression (7) such as $$S(i)+Cn \cdot C(n-1) \cdot S(i-1)+Cn \cdot C(n-2) \cdot S(i-2)+Cn \cdot C(n-3) \cdot S(i-3)$$

are simply one of the eight combinations:

$$S(i)+S(i-1)+S(i-2)+S(i-3)$$
$$S(i)+S(i-1)+S(i-2)-S(i-3)$$
$$S(i)+S(i-1)-S(i-2)+S(i-3)$$
$$S(i)+S(i-1)-S(1-2)-S(i-3)$$
$$S(i)-S(i-1)+S(i-2)+S(i-3)$$
$$S(i)-S(i-1)+S(i-2)-S(i-3)$$
$$S(i)-S(i-1)-S(i-2)+S(i-3)$$
$$S(i)-S(i-1)-S(i-2)-S(i-3)$$

according to the polarities of the three coefficients $$Cn \cdot C(n-1); \; Cn \cdot C(n-2); \text{ and } Cn \cdot C(n-3).$$

If the immediately following correlation was computed after receipt of sample S(i+1) in the same manner, it would require one of the eight precombinations:

$$S(i+1)+S(i)+S(i-1)+S(i-2)$$
$$S(i+1)+S(i)+S(i-1)-S(i-2)$$
$$S(i+1)+S(i)-S(i-1)+S(i-2)$$
$$S(i+1)+S(i)-S(i-1)-S(i-2)$$
$$S(i+1)-S(i)+S(i-1)+S(i-2)$$
$$S(i+1)-S(i)+S(i-1)-S(i-2)$$
$$S(i+1)-S(i)-S(i-1)+S(i-2)$$
$$S(i+1)-S(i)-S(i-1)-S(i-2)$$

which are not the same as the first eight combinations. Likewise, the next two correlations also require different precombinations, and the same precombinations, except for a new 8 replacing the oldest 8, are only used every fourth correlation. This can be implemented of course by four copies of the same hardware operating with a successive stagger of one-sample. Each would compute 8 precombinations of four values, which requires only 10 additions if done in the Grey-code order disclosed in the above-referenced parent U.S. patent application Ser. No. 08/967,444 now U.S. Pat. No. 5,931,893. Then 15 additions are required to combine 16 selected ones of the stored precombinations in order to complete a correlation, making 25 additions in total. Each one of the four correlators, operates for one quarter of the time. The net number of additions per correlation, 25, is only slightly less than the 34 required for precombining pairs of two sample values according to the correlator 100 described in FIG. 3, but requires eight times the number of ring buffer storage elements. It is therefore desirable to use a device that is equivalent to that used in the correlator 100 described in FIG. 3 to avoid duplicating the hardware to take care of even and odd correlations, in this case to avoid needing four times the hardware. Such a device should allow four successive correlations to be expressed in terms of the same 15 sets of 8 precombinations of the same sample value quadruples, with one new set of 8 only being computed each time.

Figure 4:
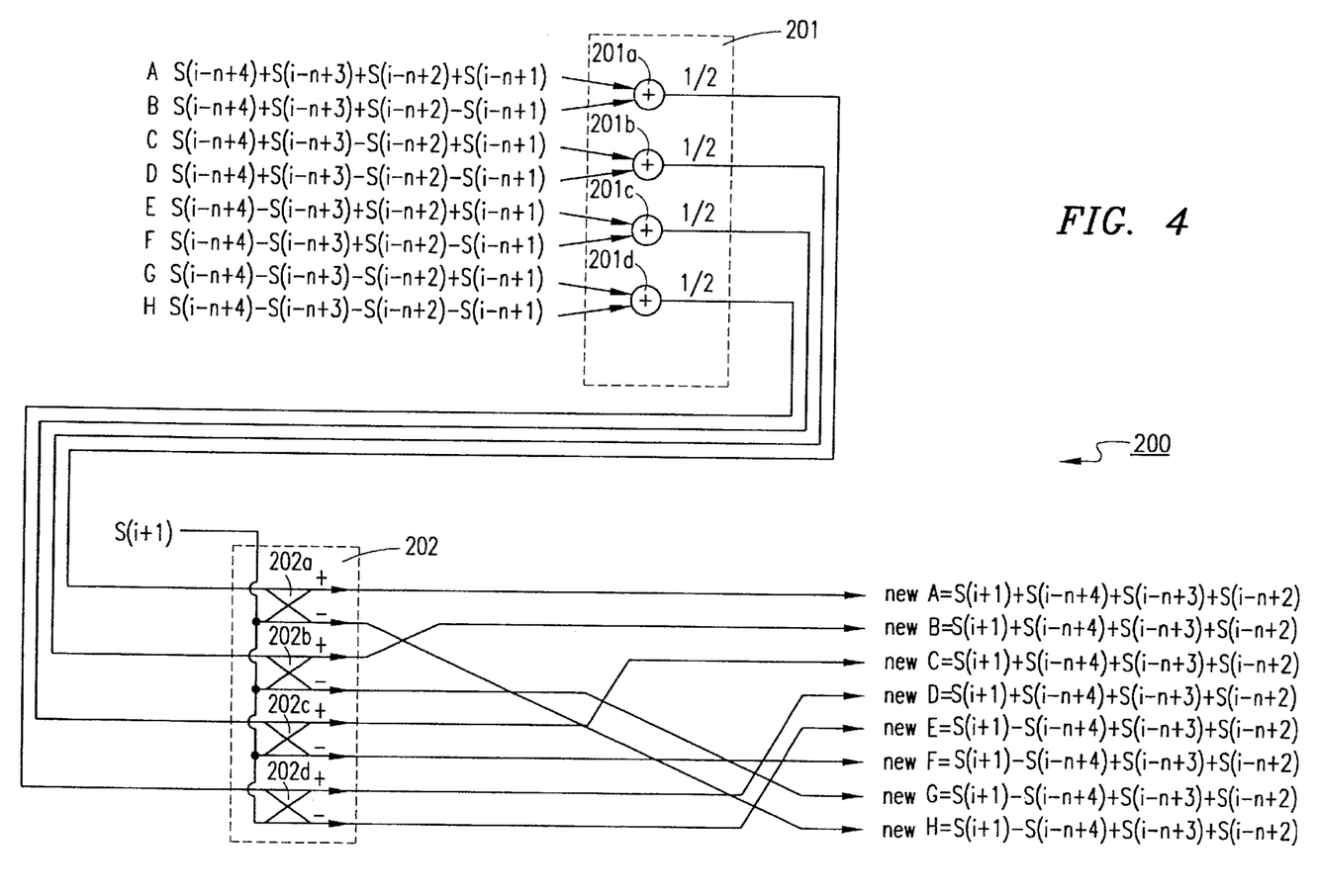
FIG. 4 shows a trellis structure for updating 8 precombinations of four samples in accordance with the present invention.

Referring to FIG. 4, there is shown a trellis structure 200 for updating 8 precombinations of four samples using adders 201 and a butterfly circuit 202. The trellis structure 200 allows four successive correlations to be expressed in terms of the same 15 sets of 8 precombinations of the same sample value quadruples, with one new set of 8 only being computed each time. The new set of eight combinations is computed from the set of 8 combinations involving the oldest sample value, plus one new sample, as shown in the trellis structure 200 of FIG. 4. The set of oldest precombinations are denoted by A . . . H in FIG. 4, where their equations are given in terms of the four oldest samples S(i−n+4); S(i−n+3); S(i−n+2) and S(i−n+1.)

To remove the contribution of the oldest sample S(i−n+1), adders 201 combine those pairs of values that differ in the sign of their S(i−n+1) constituents. For example, $$A+B=2(S(i-n+4)+S(i-n+3)+S(i-n+2))$$

Because of the factor of 2, the least significant bit (LSB) must be zero and is simply discarded to provide (A+B)/2. Then a butterfly circuit 202 computes the sum and the difference between new sample S(i+1) and (A+B)/2 to yield new values A . . . H as given by the equations at the bottom of FIG. 4. A criss-cross trellis connection is used to ensure that the new values are stored in positions corresponding to the same sign patterns as before. Thus, for example, the old values of C and D combine to yield, not new values for C and D, but new values for B and G. If the entire operation in the trellis structure 200 of FIG. 4 is done in parallel using four adders 201 and four butterfly circuits 202, the new values are all computed at the same time and may overwrite the old values, without danger of overwriting an old value that is still needed. Alternatively, if one adder 201 and butterfly circuit 202 are used sequentially four times, the new values A . . . H must be written into an alternative set of 8 stores to avoid overwriting the old A . . . H prematurely. The trellis structure 200 of FIG. 4 may be repeated with new input samples S(i), S(i+1), S(i+2), and S(i+3) to provide the precombinations needed for the successive correlations in which S(i), S(i+1), S(i+2), and S(i+3) are successively received. Then, the address counter is incremented to address the next set of 8 stores A . . . H in the 16×8 ring buffer prior to computing the correlation for newest sample S(i+4) in the same manner, the previously used 8 stores A . . . H now containing precombinations of S(i+3), S(i+2), S(i+1) and S(i) which replace combinations of the four previously oldest samples.

Figure 5:
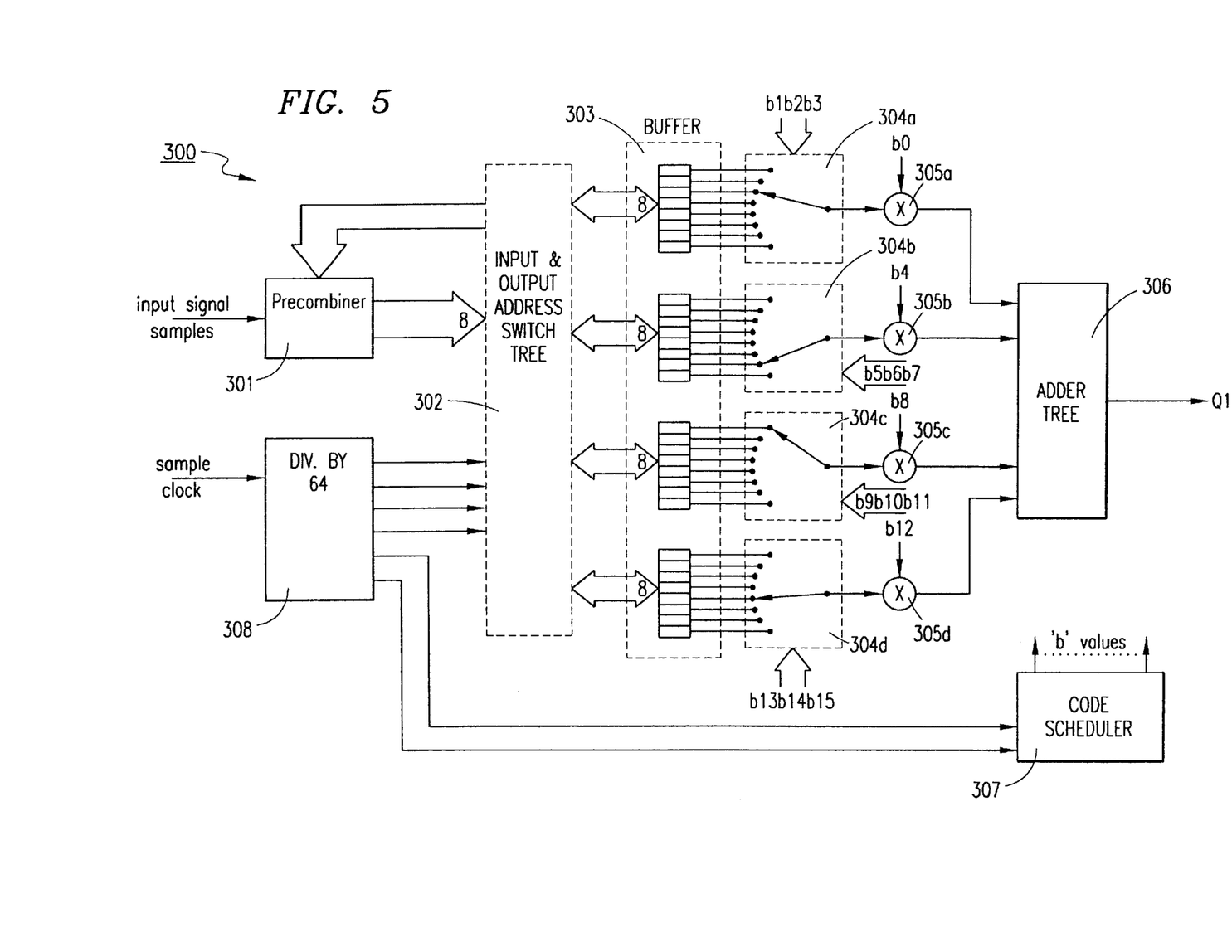
FIG. 5 is a schematic diagram of a part of a 64-bit correlator using precombinations of four samples in accordance with the present invention.

Referring to FIG. 5, there is shown a part of a 64-bit correlator 300 using precombinations of four sample values. The correlator 300 comprises a precombiner 301, a switch tree 302, a ring buffer 303, a plurality of eight-way selectors 304, a corresponding plurality of sign changers 305, an adder tree 306, a code scheduler 307, and an address counter 308. The precombiner 301 operates according to the trellis structure 200 of FIG. 4 to update a selected 8 of the precombinations each time a new sample is received. The same 8 stores are updated four times in succession, after which the address counter 308 increments to address the next group of 8 stores in the ring buffer 303. Because the address counter 308 now selects the outputs of a group of eight stores, as well as steering new values to their inputs, the switch tree 302 comprises both an input switch tree for steering values to the stores, and an output switch tree for selecting values form the stores. The switch tree 302 may be a single, bidirectional switch tree using CMOS bilateral switches if desired, and the stores can be enabled to be read (i.e., to place their stored values on an associated I/O bus), or to be written (i.e., to accept the value on the I/O bus for storage). For a 64-bit correlator, the address counter 308 is a 6-bit counter that divides by 64. The most significant four bits supply the address of the set of 8 stores selected by the switch tree 302, while the least significant two bits select the appropriate one of four distinct output bit patterns from the code scheduler 307 during four successive correlations, the pattern then repeating with a one place rotation of the output bit patterns from the code scheduler 307. The code scheduler 307 supplies 16 sets of three control bits to 16 eight-way selectors 304 (of which only four are shown for simplicity) and 16 sign changing bits to 16 corresponding sign changers 305 (of which only four are shown for simplicity) in accordance with equation (7). The use of the code bits C(1) . . . C(64) is merely rotated one place between each successive correlation before computing the control bits b(i) The adder tree 306 adds the 16 selected precombinations using 8+4+2+15 pairwise adders to obtain each new correlation. Thus, each correlation requires 12 additions or subtractions for the trellis structure 200 shown in FIG. 4 plus 15 for the correlator 300 shown in FIG. 5, making 27 in total.

The saving in effort from the correlator 100 shown in FIG. 3 (34 additions) to the combination of the trellis structure 200 shown in FIG. 4 and the correlator 300 shown in FIG. 5 (27 additions) is perhaps greater than appears, as a butterfly circuit can simultaneously form a sum and a difference with less than twice the complexity of a sum or difference alone. The equivalent complexity of the trellis structure 200 of FIG. 4 is thus around 10 operations rather than 12. The gain in using precombinations of four values is, however, still perhaps small compared with the correlator 100 of FIG. 3 and may not justify the extra complexity. However, when it is desired to perform 64-bit correlations with more than one 64-bit codeword at the same time, the effort and hardware to compute and store precombinations can be common to all the correlations, and only the code scheduler and the adder tree need to be duplicated per code. Thus, the complexity to perform four 64-bit correlations, for example, is 12+4×15=72 equivalent additions, compared to 3+4×31=127 equivalent additions for the correlator 100 of FIG. 3. Moreover, if the adder tree is fast enough to be used successively four times with different 64-bit codes during one sample period, no extra hardware is required to perform the four correlations with four different codewords. Since the present invention allows the number of stages in the adder tree to be reduced, it also allows the ripple-though propagation to be reduced and helps to increase speed, thus allowing more correlations to be performed with the same hardware.

In general, the more codes with which the input samples must be correlated, or the longer the codes, the larger is the number of precombinations which one is justified in computing in order to minimize total power complexity, as described in the above-referenced parent U.S. patent application Ser. No. 08/967,444 now U.S. Pat. No. 5,931,893.

Figure 6:
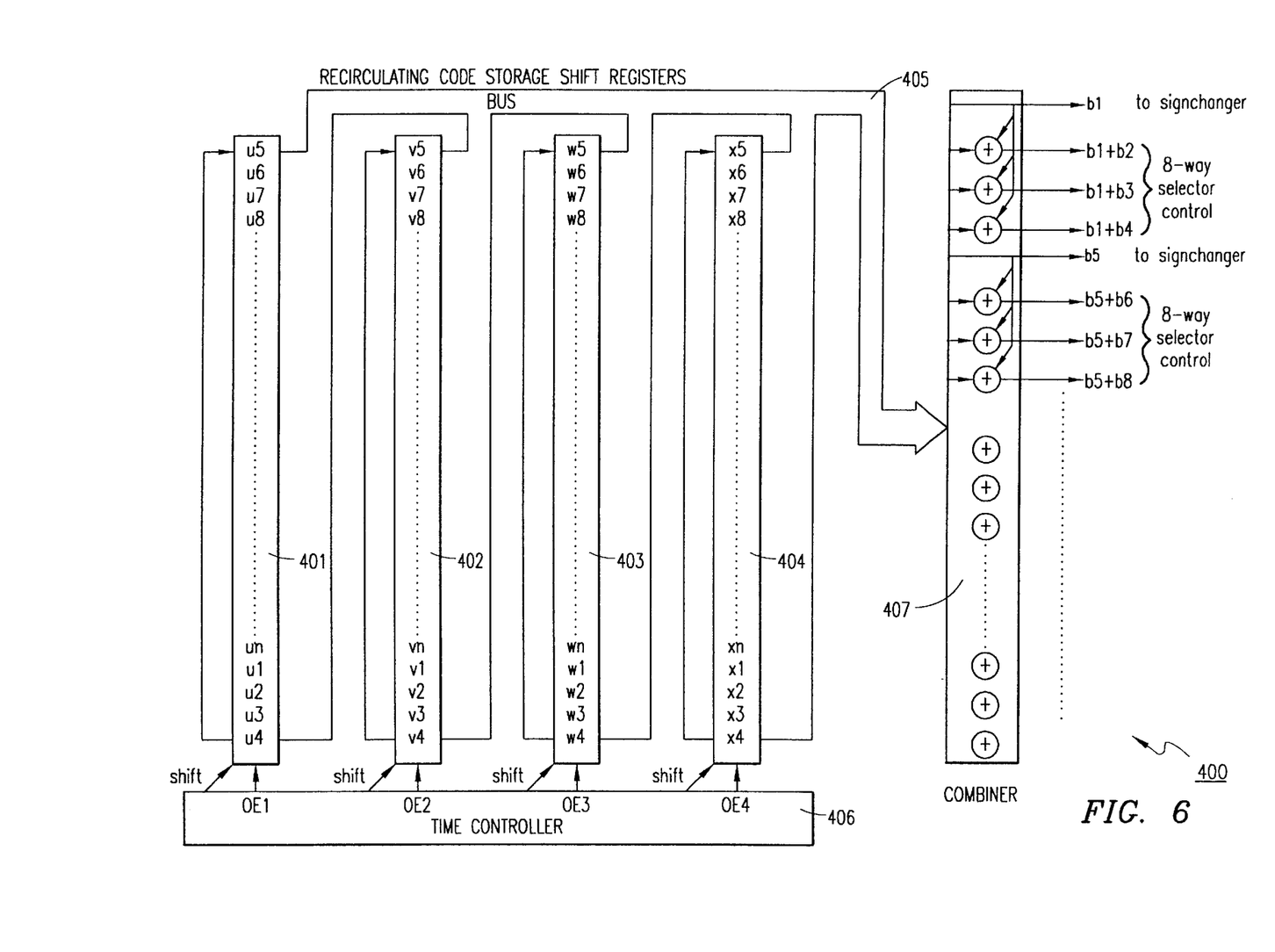
FIG. 6 is a schematic diagram of a code scheduler for correlating with four codes in accordance with the present invention.

Referring to FIG. 6, there is shown a code scheduler 400 for correlating with four 64-bit codes. The code scheduler 400 comprises four recirculating shift registers 401, 402, 403, 404, an n-bit wide bus 405, a timing controller 406, and a combiner 407. The four recirculating shift registers 401, 402, 403, 404 store respective ones of four n-bit codes which are to be correlated with received signal samples. The outputs of the shift registers are connected to the n-bit wide bus 405, and can be enabled or "tristated" by activating an associated one of the output enable control lines OE1, OE2, OE3, OE4. By enabling the outputs in turn the n-bit codes (u1 . . . un), (v1 . . . vn), (w1 . . . wn), and (x1 . . . xn) are successively used to form a correlation. After each code has been used, its recirculating shift register is rotated one place by activating one of the shift lines. The OE and shift lines are thus activated sequentially for the four codes by the timing controller 406 in order to produce four correlations, one with each code, for each new signal sample received.

When precombinations of four signal samples are used to shrink the adder tree, as in the trellis structure 200 of FIG. 4 and the correlator 300 of FIG. 5, three control bits for each 8-way selector must be supplied, together with a sign-changer bit. These are formed in the combiner 400 of FIG. 6. Bits from stages 1,5,9 . . . of the selected code register are output directly to the sign changers 305 of FIG. 5, while bits 2, 3, and 4 are exclusive-ORed with bit 1 to produce the three control bits for the first eight-way selector 304$a$; bits 6, 7 and 8 are exclusive-ORed with bit 5 to produce control bits for the second eight-way selector 304$b$; and so forth.

Thus, combining the concepts described above with reference to the trellis structure 200 of FIG. 4, the correlator 300 of FIG. 5, and the code scheduler 400 of FIG. 6, results in an inventive, low-power correlator that produces, for each new sample received, correlations between the last 64 samples and each of four 64-bit codes, with a total effort of approximately 12+4×15=72 equivalent additions per four correlations. That is 18 additions per correlation, which is much more efficient than the 63 additions per correlation of the prior art correlator 20 of FIG. 2.

At this point it should be noted that in the two examples of FIGS. 3 and 5, the number of samples that were precombined, 2 and 4, respectively, were divisible into the correlation length of 64. Since the number of precombinations required of N bits increases exponentially as $2^{N-1}$, the number of precombinations increased from 2 to 8, respectively. Precombining more than four samples, while still combining a number divisible into the correlation length of 64, would require eight samples to be precombined giving 128 results, which is excessive and beyond the optimum that minimizes complexity. However, it would be desirable to be able to precombine other numbers of samples, such as 3 or 5, which are not divisible into the correlation length, in order to see if even lower complexity may be achieved.

Figure 7:
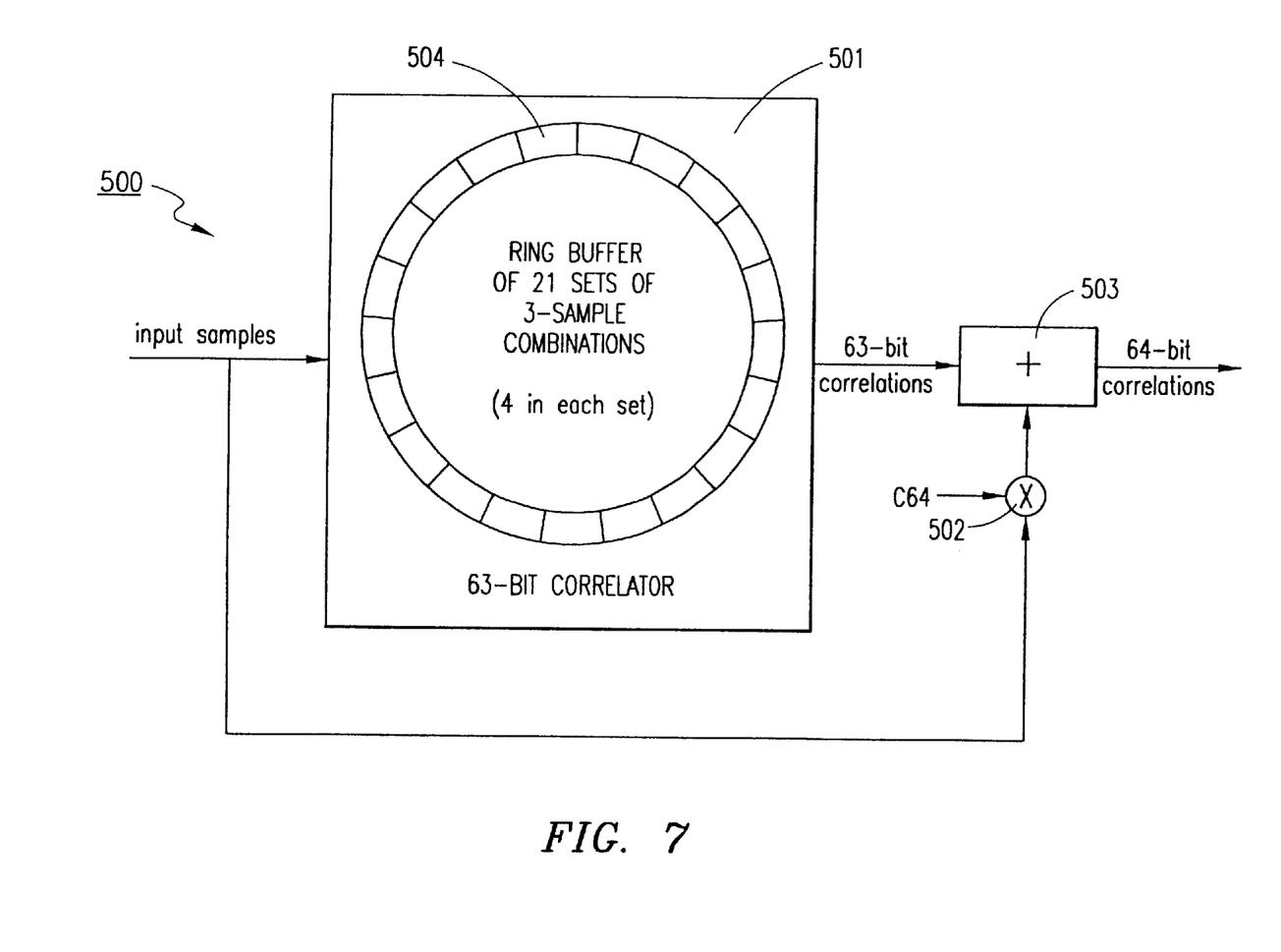
FIG. 7 is a schematic diagram of a 64 bit correlator using a 63-bit correlator employing 21 sets of 3-sample precombinations in accordance with the present invention.

For example, referring to FIG. 7, there is shown a 64-bit correlator 500 comprising a 63-bit correlator 501, a sign changer 502, and an adder 503. Although, the 64-bit correlator 500 operates using the 63-bit correlator 501, which is divisible by three, an extra sample can be added or subtracted to provide 64-bit correlations. In the correlator 500 of FIG. 7, precombinations of three samples result in four possibilities. That is, a ring buffer 504 is organized as 21 stages of four buffer elements each, the four buffer elements holding the four precombinations of each group of three successive signal samples for 63 successive samples. Within the 63-bit correlator 501, twenty-one 4-way selectors are connected to each group of four buffer elements and are controlled by two bits, such as (b1+b2) and (b1+b3), to select one of each four precombinations according to the code bits.

The b1 code bit and every third bit of the first 63 code bits are fed to 21 sign changers within the 63-bit correlator 501, and the outputs of the 21 sign changers are fed to a 21-input adder tree within the 63-bit correlator 501. The 64th signal sample is multiplied directly with code bit 64 by sign changer 502, and the result is added by adder 503 to the output of the 21-input adder tree, as shown. The 21-input adder tree could, for example, be a 24-input adder tree with two inputs unused. Such a 24-input adder tree could be constructed as three, 8-input adder trees, the outputs of which are added in a 3-input adder.

When the 65th signal sample is received, the first signal sample is no longer needed because it is more than 64 signal samples old and therefore outside the correlation window. Thus, the contribution of the first signal sample is replaced with the contribution of the latest signal sample, signal sample 64, by modifying the precombinations of old signal samples 1, 2, and 3 to be precombinations of signal samples 2, 3, and 64. This can be done using a trellis structure such as shown in FIG. 8.

Figure 8:
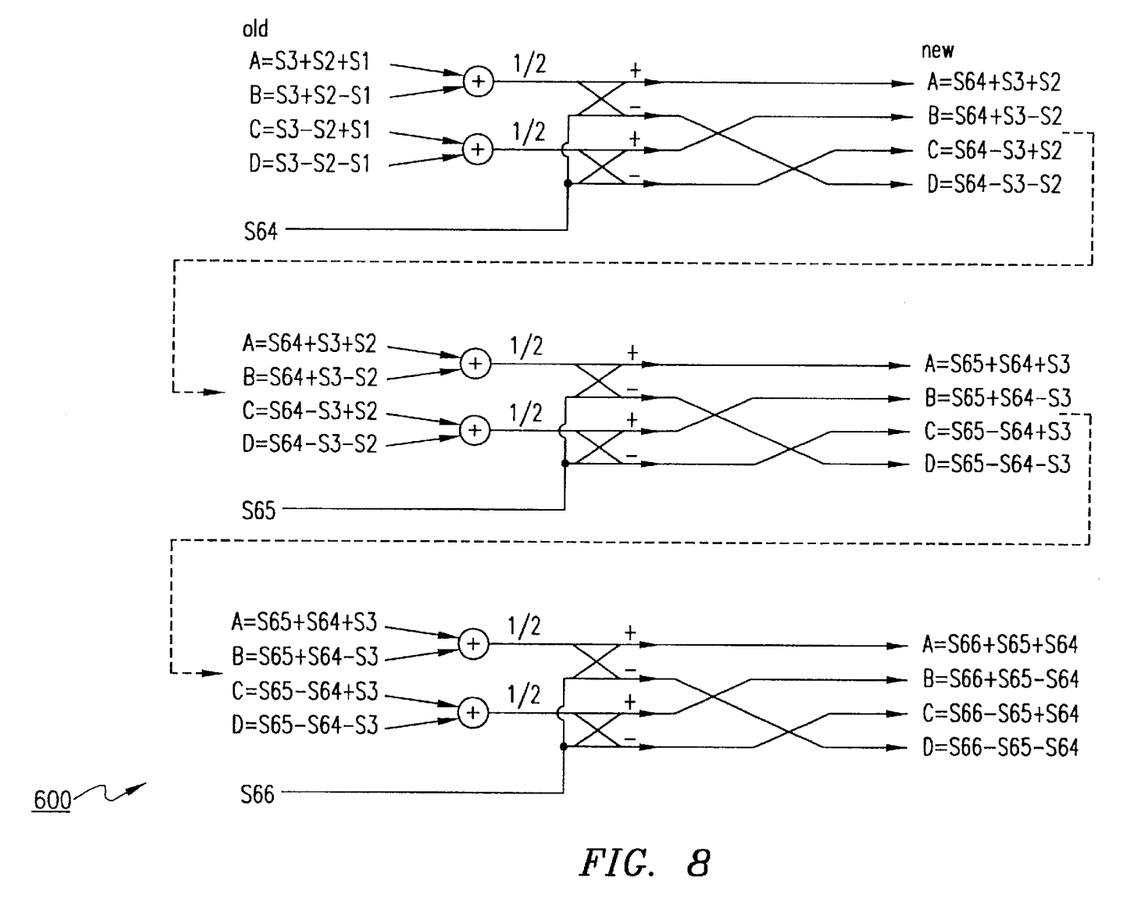
FIG. 8 shows a trellis structure for updating of 3-sample precombinations in accordance with the present invention.

Referring to FIG. 8, there is shown a trellis structure 600 wherein four buffer elements A, B, C, and D are holding four combinations of the three oldest signal samples, S1, S2, and S3 at the time when signal sample 564 is received and is used to complete a 64-bit correlation. The first signal sample, S1, thus moves out of the correlation window and signal sample S64 moves in. In order to express the next correlation in terms of 20 of the same 3-sample combinations as before and modifying only one precombination, the trellis structure 600 is shown using the old values of A, B, C, and D with the latest received signal sample, S64, in order to delete the contribution of the oldest signal sample, S1, and thereby form precombinations of S64, S3, and S2 instead. After the next signal sample, S65, arrives and is used to complete another set of correlations, the contribution of S2 is deleted and precombinations of S65, S64, and S3 are formed. After the next signal sample, S66, arrives and is used to complete a further set of correlations, the buffer elements A, B, C, and D are again modified to delete the contribution of S3 and form instead combinations of S66, S65, and S64. As these latter precombinations no longer involve the oldest signal sample, S1, the buffer elements A, B, C, and D that are operated on next are changed to the next set of four around a ring buffer of 21 sets of four, which contain precombinations of the now oldest signal samples S6, S5, and S4. Thus, it has been shown how it is possible to construct a correlator using precombinations even when the number of precombined signal samples is not divisible into the length of the correlation.

In the last example, a 64-bit correlation was performed using 6+21=27 additions. Four 64-bit correlations could be performed for each new signal sample using 6+4×21=90 additions, compared to 252 additions required of the prior art. It will be realized by a person skilled in the art that a 64-bit correlator could also be constructed as a 65-bit correlator, wherein the contribution of the 65th signal sample is subtracted, thus allowing precombinations of 5 signal samples to be used. By similar means, correlators of any length, even prime, may be constructed using a correlator of a more convenient length wherein contributions of additional samples are added or superfluous samples are subtracted.

A main envisioned application for the present invention is for the demodulation of wideband, direct sequence, code division multiple access signals (WBCDMA). The signal samples of such WBCDMA signals are generally complex numbers having a real and an imaginary part, and the codes with which the signal must be correlated also comprise a real and an imaginary code part. It has been previously demonstrated that complex correlations can be performed by four real correlators that form the correlations between the real code and the real signal part, the real code and the imaginary signal part, the imaginary code and the imaginary signal part, and the imaginary code and the real signal part. These four correlations are then combined into pairs to produce a real and imaginary correlation result. A technique for performing complex correlations between a complex code and a complex signal that needs only two real correlations to be computed, thereby halving the complexity and power consumption, is described in U.S. patent application Ser. No. 08/748,755, entitled "Despreading of Direct Sequence Spread Spectrum Signals", now U.S. Pat. No. 6,005,887, which is hereby incorporated by reference herein in its entirety. The technique described therein addresses the problem of performing a correlation between a given set of N signal samples and a given N+N bit complex code, but did not address repeating the correlation for every new signal sample, with a shift between the code and the signal samples. The present invention solves the problem of computing correlations on every sample shift while also requiring only double the complexity for operating with complex values, rather than four times the complexity.

When a complex code comprising two bits (Bx,By) is used to spread a CDMA signal, it is generally considered to represent the complex values Bx+jBy, which can be any of the four constellation points 1+j, 1−j, −1+j, or −1−j. However, as taught in the above-referenced Ser. No. 08/748,755 application, it can be advantageous to rotate the picture 45 degrees and consider instead the constellation points 1+j0, 0+j1, −1+j0, and 0−j1, or simply 1, j, −1, and −j, to be labeled by the bit pairs (Bx,By) in the following manner:

$Bx = 0, By = 0$ (Boolean) represents constellation value $+1$ $Bx = 0, By = 1$ represents constellation value $+j$ $Bx = 1, By = 0$ represents constellation value $-j$ $Bx = 1, By = 1$ represents constellation value $-1$ It may then be seen that the code values are +1 or −1 when Bx=By, otherwise +j or −j when Bx and By differ. In fact, the code value is Bx (algebraic +1 or −1) when Bx=By, alternatively jBx when Bx is not equal to By.

Consider now the correlation computation between complex signal samples $$(I1,Q1); (I2,Q2); (I3,Q3) \ldots (I64,Q64)$$

and a 64 complex-symbol code $$(Bx1,By1); (Bx2,By2); (Bx3,By3) \ldots (Bx64,By64)$$

which is given by $$(Bx1,By1)(I1,Q)+(Bx2,By2)(I2,Q2) \ldots +(Bx64, By64)(I64,Q64)$$

for a first shift of the signal samples relative to the code. Using the 45-degree rotated constellation, either By1 is zero and Bx1 is non-zero or vice versa, and similar cases. For each of the four cases, the first pair of terms gives:

for $By1=By2=0$: $(Bx1 \cdot I1+Bx2 \cdot I2)+j(Bx1 \cdot Q1+Bx2 \cdot Q2)$ (8)

for $By1=Bx2=0$: $(Bx1 \cdot I1-By2 \cdot Q2)+j(Bx1 \cdot Q1+By2 \cdot I2)$ (9)

for $Bx1=By2=0$: $(-By1 \cdot Q1+Bx2 \cdot I2)+j(By1 \cdot I1+Bx2 \cdot Q2)$ (10)

for $Bx1=Bx2=0$: $(-By1 \cdot Q1-By2 \cdot Q2)+j(By1 \cdot I1+By2 \cdot I2)$ (11)

Figure 9:
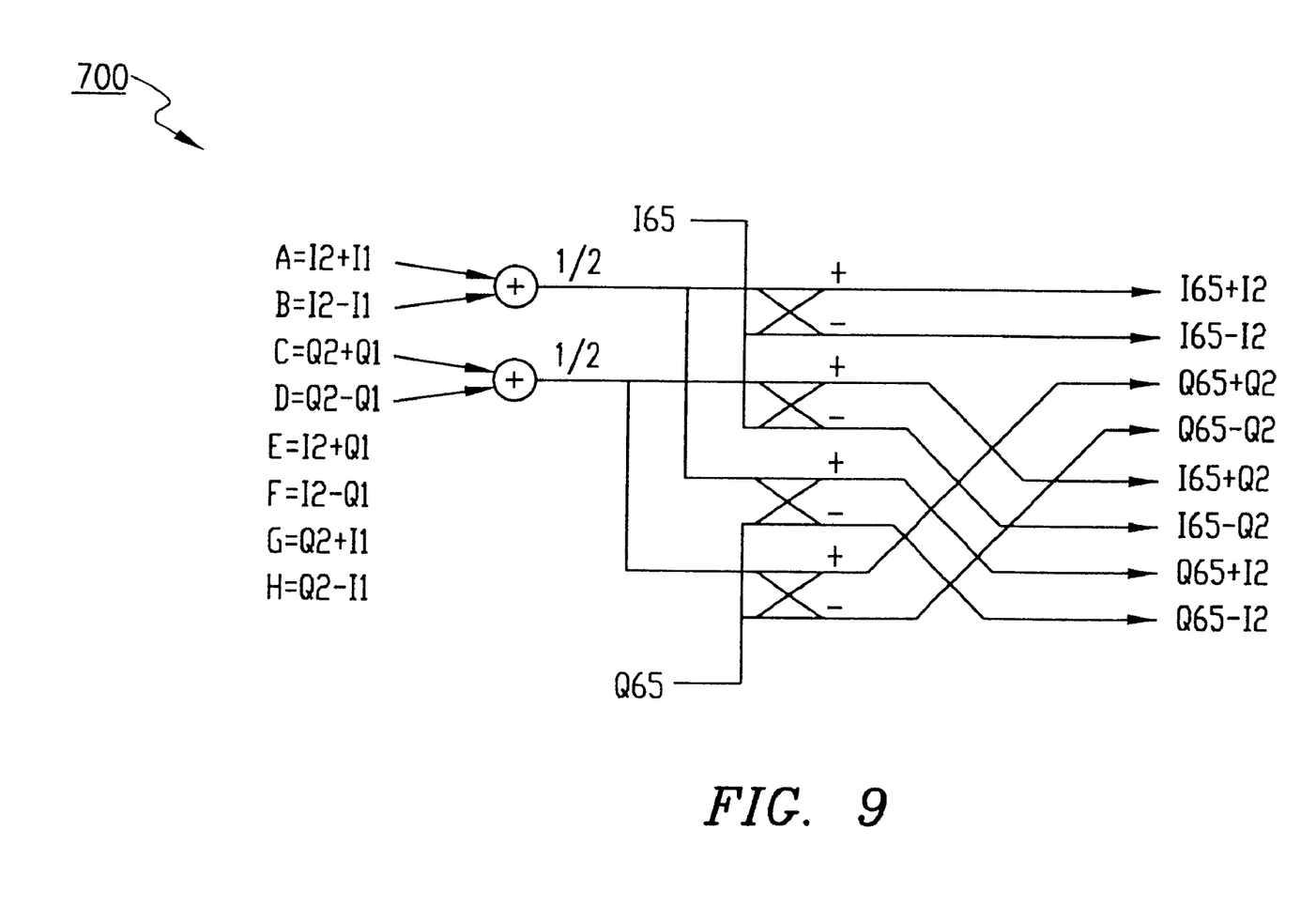
FIG. 9 shows a trellis structure for updating a complex correlator using precombinations of pairs of real or imaginary samples in accordance with the present invention.

It may be seen that, for case (8) and case (11) we need the sum and difference of I1 and I2 and also of Q1 and Q2. For cases (9) and (10) we need the sum and difference of I1 and Q2 and also of Q1 and I2. If these eight sums and differences are precomputed, the real part of the correlation may be expressed as the sum of 32 selected ones of each eight, while the imaginary part is the sum of 32 selected other ones of each eight. Thus, the complexity in terms of additions for a complex correlator is simply twice the complexity of a real correlator, and the complexity of each real correlation has been halved by the use of precombinations of pairs of samples. The number of precombinations which must be formed for this complex correlator is eight, which is twice as many as needed for two real correlators. Therefore, the number of memory elements needed for the complex correlator is four times the number of memory elements needed for one real correlator, although the power consumption is only twice. FIG. 9 shows a trellis structure 700 for updating the eight precombinations in the above-described complex correlator.

It has thus been described above how a sliding correlator, otherwise known as a matched filter for digitally coded signals, can be made with reduced power consumption compared to the prior art. The present invention involves forming precombinations of input samples which are then stored in a circular buffer, overwriting the oldest precombinations. Selectors then select certain of the precombinations from the circular buffer to be added in an adder tree, the size of the adder tree being reduced due to the forming of precombinations. In another aspect of the present invention, upon receipt of a new signal sample, the stored precombinations involving the oldest received signal sample are manipulated to delete the contribution of the oldest signal sample and include the contribution of the latest signal sample, thus avoiding storage of previous signal samples as well as previously formed precombinations of the previous signal samples. It has also been shown that the present invention can be adapted to perform correlations between either real values or complex values with advantageous reductions in power consumption and complexity. The present invention can also be applied to improving the efficiency of stored-program (software) implemented correlators that use digital signal processors, computers, or microprocessors.

In summary, a correlator for correlating the last "n" samples of a received signal with an n-digit codeword has been described, wherein one new correlation result is computed for every new received signal sample. Power consumption during continuous operation is reduced by the combined use of two techniques. First, groups of "L" signal samples are collected and precombined to yield $2^{L-1}$ precombinations; the precombined values are written into an M-element circular buffer, where $$M=(n/L) \cdot 2^{L-1}.$$

Second, new precombined values are written sequentially into the next positions of the M-element circular buffer store, overwriting the samples received "n" samples earlier, thereby avoiding shifting all "n" multi-bit samples through the buffer at each new sample instant. An adder tree connected to the outputs of the buffer storage elements through selector switches computes the desired correlation by adding or subtracting selected values in dependence on the digits of the correlation code. Since only one of each group of stored precombinations is selected to be input to the adder tree, the size of the adder tree is thereby reduced.

An exemplary 64-bit correlator comprises a 32×2 element circular buffer. A pair of new signal samples is collected and precombined to form their sum and difference every two sample clock cycles, the sum and difference being stored in the next sequential pair of the 32 pairs of buffer elements. A two-way output selector is connected to the output of each buffer element pair and controlled by the modulo-2 sum of a corresponding pair of the 64-bit correlation code bits to select either the stored sum or the stored difference to be applied to a 32-input adder tree. The adder tree either adds or subtracts each input value depending on one of the associated pair of correlation code bits, thereby reducing the adder tree size from a 64-input adder tree to a 32-input adder tree, which, combined with operating only on every alternate sample clock, approximately reduces the total power consumption by four, while providing a correlation result every two clock cycles. The intermediate correlation results needed to complete a correlation every clock cycle may be formed using a duplicate device operating with a one-sample stagger, or alternatively using the same device with an arrangement to subtract the contribution sample, giving now one correlation output per sample clock cycle for half the power consumption compared to a correlator that does not form precombinations.

The present invention is not to be limited in scope by the specific embodiments described herein. Indeed, various modifications of the present invention, in addition to those described herein, will be apparent to those of skill in the art from the foregoing description and accompanying drawings. Thus, such modifications are intended to fall within the scope of the appended claims.

What is claimed is:

1. A matched filter for correlating a sequence of signal sample values with a predetermined digital code to produce correlation values for shifts in the sequence of signal sample values relative to the predetermined digital code, comprising:
   a precombiner for combining subgroups of the signal sample values in the sequence to form sets of precombinations;
   a storage device for storing the sets of precombinations;
   a plurality of selectors for selecting one precombination from each set of stored precombinations to provide a plurality of selected precombinations; and
   an adder for adding or subtracting the plurality of selected precombinations to produce a correlation value corresponding to a shift in the sequence of signal sample values.

2. The matched filter of claim 1, wherein the signal sample values are real values.

3. The matched filter of claim 1, wherein the signal sample values are complex values, and the predetermined digital code comprises a real code and an imaginary code.

4. The matched filter of claim 3, wherein the precombiner forms the sets of precombinations from sums and differences of pairs of real or pairs of imaginary signal sample values.

5. The matched filter of claim 3, wherein the precombiner forms the sets of precombinations from a sum and a difference of the real part of one signal sample value and the imaginary part of another signal sample value.

6. The matched filter of claim 1, wherein the predetermined digital code is a segment of a direct-sequence spread-spectrum spreading code.

7. The matched filter of claim 1, wherein the matched filter decodes direct-sequence, spread spectrum signals in a RAKE receiver.

8. The matched filter of claim 1, wherein the precombiner forms the sets of precombinations from sums and differences of pairs of the signal sample values.

9. The matched filter of claim 1, wherein the precombiner forms the sets of precombinations from all possible combinations of sums and differences of a given number of the signal sample values.

10. The matched filter of claim 9, wherein only one sign polarity is used with one of the signal sample values thereby halving the number of precombinations formed in each set of precombinations.

11. The matched filter of claim 1, wherein the precombiner combines pairs of precombinations from an oldest set of precombinations to delete the contribution of an oldest one of the signal sample values in the oldest set of precombinations, and further combines the result with a newest signal sample value to produce an updated set of precombinations.

12. The matched filter of claim 11, wherein the updated set of precombinations is produced each time a new signal sample value is received.

13. The matched filter of claim 11, wherein the updated set of precombinations overwrites the oldest set of precombinations in the storage device.

14. The matched filter of claim 11, wherein the oldest set of precombinations is the set of precombinations that depends upon the oldest signal sample value the contribution of which has not yet been deleted.

15. The matched filter of claim 1, wherein the storage device is a circular buffer.

16. The matched filter of claim 1, wherein the storage device includes a routing switch tree for routing a set of precombinations to a designated set of storage elements.

17. The matched filter of claim 16, wherein the routing switch tree is a binary tree comprising a number of stages equal to the logarithm to the base two of the number of storage locations for sets of precombinations.

18. The matched filter of claim 17, wherein a stage of the binary routing switch tree having a smaller number of switch elements switches route more frequently than a stage having a greater number of switch elements.

19. The matched filter of claim 17, wherein the storage device stores the sets of precombinations in an order which is bit-reversed relative to the time-sequential order of their formation.

20. The matched filter of claim 1, wherein each of the plurality of selectors is controlled by a corresponding subgroup of bits of the predetermined digital code.

21. The matched filter of claim 20, wherein the adder adds or subtracts a corresponding selected precombination according to the polarity of one of the bits of the corresponding subgroup of bits.

22. The matched filter of claim 1, wherein the predetermined digital code comprises a first number of code symbols and the precombiner forms sets of precombinations of a subgroup containing a second number of signal sample values not divisible into the first number, wherein the matched filter comprises a correlator for correlating with a predetermined code of a length that is divisible by the second number.

23. The matched filter of claim 1, further comprising:
   a multiplier for multiplying each selected precombination with a corresponding preselected bit from the predetermined digital code to change or affirm the polarity of each selected precombination.

24. A method for correlating a sequence of signal sample values with a predetermined digital code to produce correlation values for shifts in the sequence of signal sample values relative to the predetermined digital code, the method comprising the steps of:
   combining subgroups of the signal sample values in the sequence to form sets of precombinations;
   selecting one precombination from each set of precombinations to provide a plurality of selected precombinations; and
   adding or subtracting the plurality of selected precombinations to produce a correlation value corresponding to a shift in the sequence of signal sample values.

25. The method of claim 24, further comprising the step of:
   storing the sets of precombinations after they are formed.

26. The method of claim 24, further comprising the step of:
   multiplying each selected precombination with a corresponding preselected bit from the predetermined digital code to change or affirm the polarity of each selected precombination.

27. The method of claim 24, wherein the step of combining subgroups of the signal sample values in the sequence to form sets of precombinations includes combining pairs of precombinations from an oldest set of precombinations to delete the contribution of an oldest one of the signal sample values in the oldest set of precombinations, and combining the result with a newest signal sample value to produce an updated set of precombinations.

28. The method of claim 27, wherein the updated set of precombinations is produced each time a new signal sample value is received.

29. The method of claim 27, wherein the updated set of precombinations overwrites the oldest set of precombinations.

30. The method of claim 27, wherein the oldest set of precombinations is the set of precombinations that depends upon the oldest signal sample value the contribution of which has not yet been deleted.

31. An article of manufacture for correlating a sequence of signal sample values with a predetermined digital code to produce correlation values for shifts in the sequence of signal sample values relative to the predetermined digital code, the article of manufacture comprising:

a computer readable storage medium; and computer programming stored on the storage medium;
wherein the stored computer programming is configured to be readable from the computer readable storage medium by at least one computer and thereby cause the at least one computer to operate so as to:
combine subgroups of the signal sample values in the sequence to form sets of precombinations;
select one precombination from each set of precombinations to provide a plurality of selected precombinations; and
add or subtract the plurality of selected precombinations to produce a correlation value corresponding to a shift in the sequence of signal sample values.

32. The article of manufacture of claim 31, further causing the at least one computer to operate so as to:

store the sets of precombinations after they are formed.

33. The article of manufacture of claim 31, further causing the at least one computer to operate so as to:

multiply each selected precombination with a corresponding preselected bit from the predetermined digital code to change or affirm the polarity of each selected precombination.

34. The article of manufacture of claim 31, further causing the at least one computer to operate so as to combine subgroups of the signal sample values in the sequence to form sets of precombinations by combining pairs of precombinations from an oldest set of precombinations to delete the contribution of an oldest one of the signal sample values in the oldest set of precombinations, and combining the result with a newest signal sample value to produce an updated set of precombinations.

35. The article of manufacture of claim 34, wherein the updated set of precombinations is produced each time a new signal sample value is received.

36. The article of manufacture of claim 34, wherein the updated set of precombinations overwrites the oldest set of precombinations.

37. The article of manufacture of claim 34, wherein the oldest set of precombinations is the set of precombinations that depends upon the oldest signal sample value the contribution of which has not yet been deleted.

* * * * *